United States Patent
Okada

(10) Patent No.: US 11,036,231 B2
(45) Date of Patent: Jun. 15, 2021

(54) IN-VEHICLE DEVICE AND ESTIMATION METHOD

(71) Applicant: CLARION CO., LTD., Saitama (JP)

(72) Inventor: Kazuhiro Okada, Saitama (JP)

(73) Assignee: CLARION CO., LTD., Saitama (JP)

( * ) Notice: Subject to any disclaimer, the term of this patent is extended or adjusted under 35 U.S.C. 154(b) by 37 days.

(21) Appl. No.: 16/072,352

(22) PCT Filed: Feb. 8, 2017

(86) PCT No.: PCT/JP2017/004510
§ 371 (c)(1),
(2) Date: Jul. 24, 2018

(87) PCT Pub. No.: WO2017/150106
PCT Pub. Date: Sep. 8, 2017

(65) Prior Publication Data
US 2019/0041863 A1   Feb. 7, 2019

(30) Foreign Application Priority Data

Mar. 1, 2016   (JP) .............................. JP2016-038740

(51) Int. Cl.
*G05D 1/02* (2020.01)
*G01C 21/28* (2006.01)
(Continued)

(52) U.S. Cl.
CPC ........... *G05D 1/0221* (2013.01); *G01C 21/28* (2013.01); *G01S 13/723* (2013.01);
(Continued)

(58) Field of Classification Search
CPC .... G05D 1/0221; G05D 1/0278; G01C 21/26; G01C 21/28; G01S 13/723; H03H 17/0257
See application file for complete search history.

(56) References Cited

U.S. PATENT DOCUMENTS

2008/0294342 A1* 11/2008 Hoshizaki ............... G01S 19/47
701/472
2009/0093924 A1* 4/2009 Aso ........................ B60W 40/10
701/31.4
(Continued)

FOREIGN PATENT DOCUMENTS

JP     2000-55678 A    2/2000
JP     2001-174275 A   6/2001
(Continued)

OTHER PUBLICATIONS

English machine translation of Wataru (JP-5692044-B2) (Year: 2015).*

(Continued)

*Primary Examiner* — Bao Long T Nguyen
*Assistant Examiner* — Bakari Underwood
(74) *Attorney, Agent, or Firm* — IP Business Solutions, LLC

(57) ABSTRACT

An object is to enable a state of a vehicle to be precisely estimated by a Kalman filter. A navigation system 1 includes an observation unit 21 that observes an observable concerning a variation of the vehicle, based on an output from a sensor, and an estimation unit 22 that estimates a state quantity indicating a state of the vehicle by a Kalman filter, and the estimation unit 22 calculates a prediction value of the state quantity of the vehicle, calculates an error covariance matrix of the prediction value, by the Kalman filter to which an error of the observable is inputted as an error of the state quantity which is in a relation of calculus with the observable, and calculates an estimation value of the state quantity of the vehicle and an error covariance matrix of the estimation value by the Kalman filter, based on the prediction value and the error covariance matrix of the prediction value which are calculated.

6 Claims, 4 Drawing Sheets

(51) Int. Cl.
  *G01S 13/72* (2006.01)
  *H03H 17/02* (2006.01)
  *G01C 21/26* (2006.01)
(52) U.S. Cl.
  CPC ......... *H03H 17/0257* (2013.01); *G01C 21/26* (2013.01); *G05D 1/0278* (2013.01)

(56) References Cited

U.S. PATENT DOCUMENTS

| | | | | |
|---|---|---|---|---|
| 2010/0117895 | A1* | 5/2010 | Mizuochi | G01S 19/49 342/357.23 |
| 2011/0288722 | A1 | 11/2011 | Tanino | |
| 2017/0123060 | A1 | 5/2017 | Yamashita | |

FOREIGN PATENT DOCUMENTS

| | | | |
|---|---|---|---|
| JP | 2008-076096 A | 4/2008 | |
| JP | 2011247721 A * | 12/2011 | ........... G01S 13/931 |
| JP | 2014-142272 A | 8/2014 | |
| JP | 5692044 B2 * | 4/2015 | |
| WO | 2015162873 A1 | 10/2015 | |

OTHER PUBLICATIONS

English machine translation of Takabayashi (JP-2011247721-A) (Year: 2011).*
International Search Report issued for corresponding PCT/JP2017/004510application.
Written Opinion of the International Search Authority issued for corresponding PCT/JP2017/004510 application.
Notice of Reasons for refusal dated Aug. 6, 2019, Japanese Patent Application No. 2016-038740 filed on Mar. 1, 2016.
International Preliminary Report on Patentability dated Sep. 13, 2018 for the corresponding PCT/JP2017/004510.
Written Opinion of the International Searching Authority issued for the corresponding PCT/JP2017/004510.
Extended European Search Report dated Oct. 2, 2019 for Counterpart European Patent Application No. 17759577.4-1003/3425338 filed on Feb. 8, 2017.

* cited by examiner

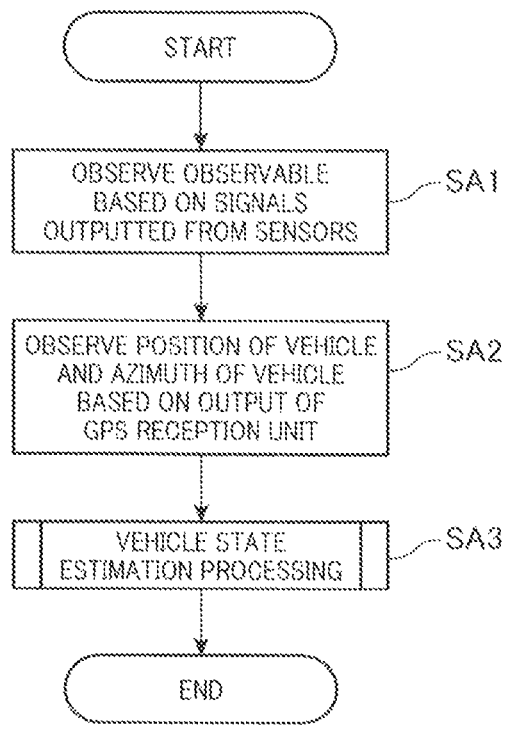

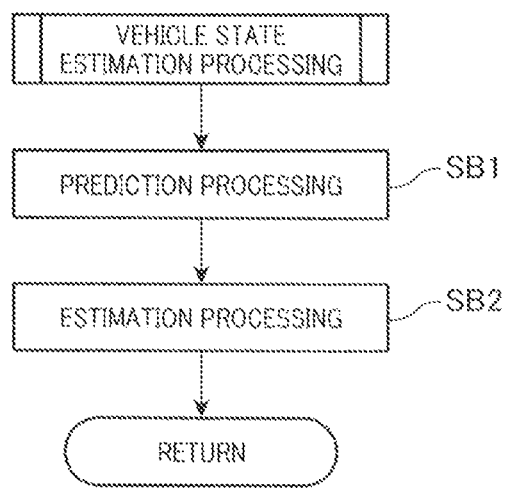

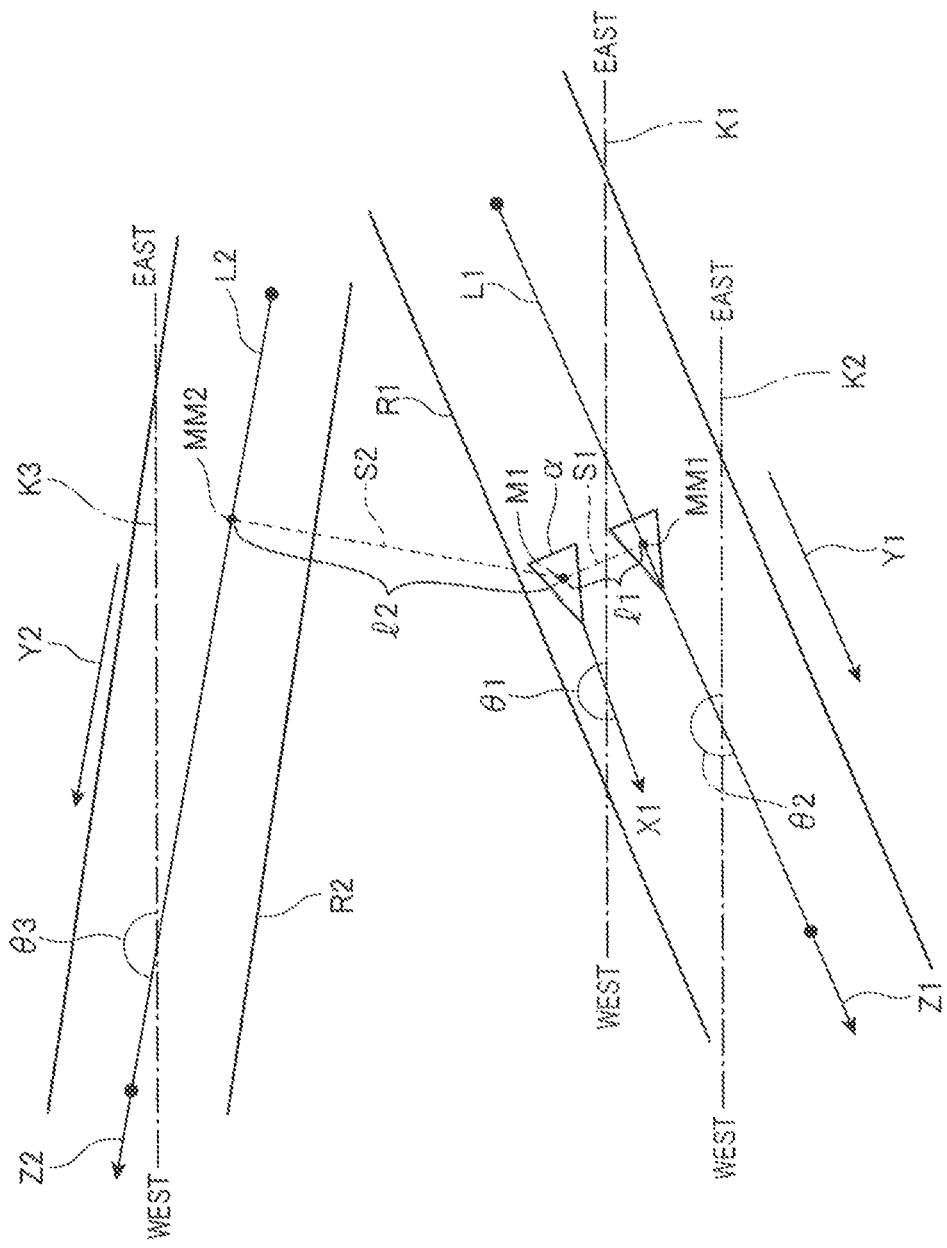

IN-VEHICLE DEVICE AND ESTIMATION METHOD

TECHNICAL FIELD

The present invention relates to an in-vehicle device and estimation method.

BACKGROUND ART

As a related art of the present technical field, there is Japanese Patent Laid-Open No. 2000-55678 (Patent Literature 1). Patent Literature 1 indicates that "a Kalman filter (an error estimation unit 15) is included, which uses, as an observation value, a difference between estimation navigation data (a vehicle speed, an absolute azimuth and an absolute position) calculated by a relative trajectory calculation unit 13, and an absolute position calculation unit 14 based on a moving distance and an azimuth change amount that are calculated in a moving distance calculation unit 11 and an azimuth change amount calculation unit 12 from detection values in a vehicle speed sensor 4 and a gyro 6, and GPS positioning data (a speed, an azimuth and a position) from a GPS receiver 8, and as one of the quantities of state, an error of a conversion gain from a gyro output to an angular speed (a gain error) is set. Based on an estimation value of the gain error obtained by the Kalman filter, the azimuth change amount calculated by using the gyro output and the conversion gain is corrected."

CITATION LIST

Patent Literature

[Patent Literature 1]
Japanese Patent Laid-Open No. 2000-55678

SUMMARY OF INVENTION

Technical Problem

Incidentally, errors may be accumulated with a lapse of time, in a moving distance and an azimuth change amount that are obtained from observables such as a speed and an angular speed that are observed based on outputs from sensors of a vehicle speed pulse, a gyro and the like. Patent Literature 1 does not disclose an art of estimating a state of a vehicle by a Kalman filter with an accumulating error taken into consideration, and cannot estimate the state of the vehicle precisely by the Kalman filter.

Therefore, an object of the present invention is to enable a state of a vehicle to be estimated precisely by a Kalman filter.

Solution to Problem

In order to attain the above described object, an in-vehicle device is an in-vehicle device that is loaded on a vehicle, including an observation unit that observes an observable concerning a variation of the vehicle, based on an output from a sensor, and a control unit that estimates a state quantity indicating a state of the vehicle by a Kalman filter, wherein the control unit calculates a prediction value of the state quantity of the vehicle, calculates an error of the prediction value, by the Kalman filter to which an error of the observable is inputted as an error of the state quantity which is in a relation of calculus with the observable, and calculates an estimation value of the state quantity of the vehicle and an error of the estimation value by the Kalman filter, based on the prediction value and the error of the prediction value which are calculated.

Advantageous Effects of Invention

According to the present invention, the state of the vehicle can be estimated with high precision by a Kalman filter.

BRIEF DESCRIPTION OF THE DRAWINGS

FIG. 2 is a flowchart illustrating an operation of the navigation system;
FIG. 3 is a flowchart illustrating an operation of an estimation unit in vehicle state estimation processing;
FIG. 4 is a diagram for explaining map matching based on an estimated vehicle state.

DESCRIPTION OF EMBODIMENT

Figure 1:
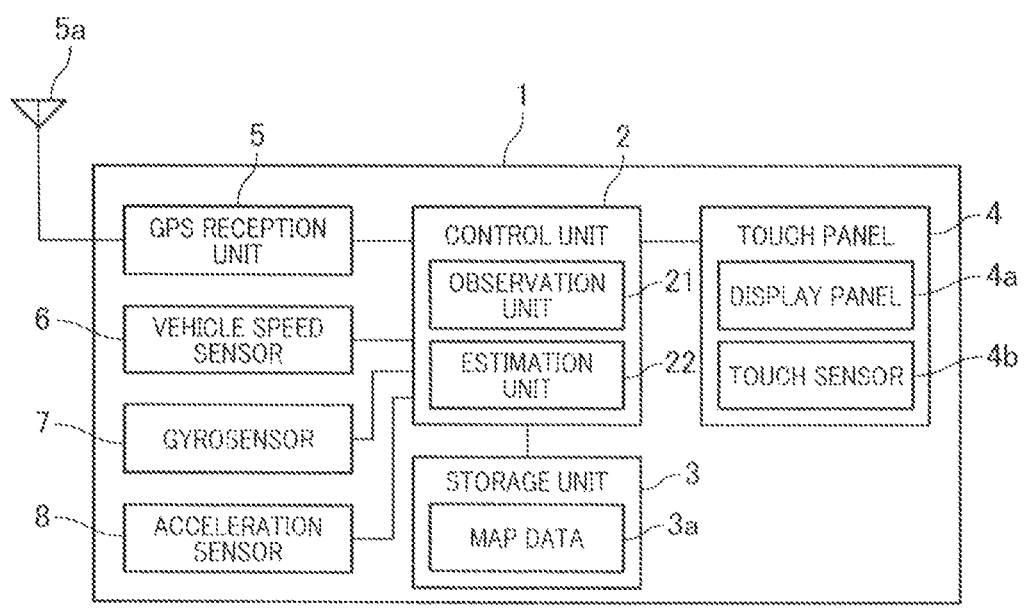
FIG. 1 is a block diagram illustrating a configuration of a navigation system.

FIG. 1 is a block diagram illustrating a configuration of a navigation system 1 (an in-vehicle device).

The navigation system 1 is an in-vehicle device that is installed on a vehicle, and executes display of a map, display of a present location of a vehicle in the map, route search to a destination, route guide and the like in accordance with an operation of a user riding in a vehicle. Note that the navigation system 1 may be fixed to a dashboard or the like of the vehicle, or may be attachable to and detachable from the vehicle.

As illustrated in FIG. 1, the navigation system 1 includes a control unit 2, a storage unit 3, a touch panel 4, a GPS reception unit 5, a vehicle speed sensor 6 (sensor), a gyro sensor 7 (angular speed sensor, sensor), and an acceleration sensor 8 (sensor).

The control unit 2 includes a CPU, a ROM, a RAM, other control circuits and the like, and controls the respective units of the navigation system 1. The control unit 2 functions as an observation unit 21 and an estimation unit 22 that will be described later, by executing a control program stored in the ROM, the storage unit 3, and the like.

The storage unit 3 includes a hard disk, a nonvolatile memory such as an EEPROM, and stores data to be rewritable. The storage unit 3 stores map data 3a in addition to control programs executed by the control unit 2. The map data 3a has node information concerning nodes representing intersection points, other connection points on a road network, link information concerning links representing road sections between nodes and nodes, information relating to display of maps and the like. The link information includes at least information concerning a position of a link and information concerning an azimuth of the link, for each of the links.

The touch panel 4 includes a display panel 4a and a touch sensor 4b. The display panel 4a is configured by a liquid crystal display, an EL (Electro Luminescent) display or the like, and displays various kinds of information on the display panel 4a under control of the control unit 2. The touch sensor 4b is disposed by being superimposed on the display panel 4a, detects a touch operation of a user, and outputs a signal indicating a position to which the touch operation is applied to the control unit 2. The control unit 2 executes processing corresponding to the touch operation based on an input from the touch sensor 4b.

The GPS reception unit 5 receives a GPS radio wave from a GPS satellite via a GPS antenna 5a, and acquires a position of a vehicle and a compass bearing of a traveling direction of the vehicle (hereinafter, expressed as "an azimuth of the vehicle") by arithmetic operation, from a GPS signal superimposed on the GPS radio wave. The GPS reception unit 5 outputs information indicating the position of the vehicle, and information indicating the azimuth of the vehicle to the control unit 2.

The vehicle speed sensor 6 detects a vehicle speed of the vehicle, and outputs a signal indicating the detected vehicle speed to the control unit 2.

The gyro sensor 7 is configured by a vibration gyro, for example, and detects an angular speed by rotation of the vehicle. The gyro sensor 7 outputs a signal indicating the detected angular speed to the control unit 2.

The acceleration sensor 8 detects an acceleration (for example, an inclination of the vehicle relative to a traveling direction) that acts on the vehicle. The acceleration sensor 8 outputs a signal indicating the detected acceleration to the control unit 2.

As illustrated in FIG. 1, the control unit 2 includes the observation unit 21 and the estimation unit 22.

The observation unit 21 observes observables concerning a variation of the vehicle, based on the signals outputted from the vehicle speed sensor 6, the gyro sensor 7, and the acceleration sensor 8. In the present embodiment, the observation unit 21 observes the speed (the observable) of the vehicle as the observable based on the signal indicating the vehicle speed, which is outputted from the vehicle speed sensor 6. The observation unit 21 calculates the speed of the vehicle and an error of the speed of the vehicle from the signal indicating the vehicle speed by a predetermined arithmetic operation. The error of the speed of the vehicle which is calculated is an error accumulating in the moving distance obtained from the speed.

Further, the observation unit 21 observes the angular speed (observable) by rotation of the vehicle as an observable, based on a signal indicating the angular speed, which is outputted from the gyro sensor 7. The observation unit 21 calculates the angular speed of the vehicle and an error of the angular speed of the vehicle from the signal indicating the angular speed by a predetermined arithmetic operation. The error of the angular speed of the vehicle which is calculated is an error accumulating in an azimuth change amount obtained from the angular speed.

Further, the observation unit 21 observes an acceleration of the vehicle as an observable, based on the signal indicating an acceleration (observable), which is outputted from the acceleration sensor 8. The observation unit 21 calculates the acceleration of the vehicle and an error of the acceleration of the vehicle from the signal indicating the acceleration by a predetermined arithmetic operation. The error of the acceleration of the vehicle which is calculated is an error accumulating in a speed obtained from the acceleration.

Further, the observation unit 21 observes the position of the vehicle and the azimuth of the vehicle, based on the information indicating the position of the vehicle and the information indicating the azimuth of the vehicle that are outputted from the GPS reception unit 5.

The estimation unit 22 estimates a state quantity indicating a state of the vehicle by a Kalman filter, based on the speed of the vehicle, the acceleration of the vehicle, the angular speed of the vehicle, the position of the vehicle, and the azimuth of the vehicle, which are observed by the observation unit 21. In the present embodiment, the estimation unit 22 estimates the position of the vehicle, the azimuth of the vehicle, the speed of the vehicle, and the angular speed of the vehicle as the state quantities of the vehicle.

As will be described later, the control unit 2 executes evaluation of links which are objects of map matching based on the state quantities of the vehicle, which are estimated by the estimation unit 22.

Note that the speed of the vehicle estimated by the estimation unit 22 corresponds to the state quantity of the vehicle. Further, the speed of the vehicle observed by the observation unit 21 corresponds to the observable. Likewise, the angular speed of the vehicle estimated by the estimation unit 22 corresponds to the state quantity of the vehicle. Further, the angular speed of the vehicle observed by the observation unit 21 corresponds to the observable.

Here, estimation of basic state quantities of the vehicle by the Kalman filter will be described.

In the present embodiment, the state quantities of the vehicle which are estimated by the Kalman filter are the position of the vehicle, the azimuth of the vehicle, the speed of the vehicle and the angular speed of the vehicle. Hereinafter, respective state quantities of the vehicle that are estimated will be shown.

x: x-coordinate of the position of the vehicle
y: y-coordinate of the position of the vehicle
θ: azimuth of the vehicle
v: speed of the vehicle
ω: angular speed of the vehicle Here, when state vectors expressing the state quantities of the vehicle by vectors are (x, y, θ, v, ω), the state equation about the state quantities of the vehicle is expressed by equation (1).

[Expression 1]

$$\begin{bmatrix} x_{k+1} \\ y_{k+1} \\ \theta_{k+1} \\ v_{k+1} \\ \omega_{k+1} \end{bmatrix} = \begin{bmatrix} x_k + \cos(\theta_k)v_k T \\ y_k + \sin(\theta_k)v_k T \\ \theta_k + \omega_k T \\ v_k \\ \omega_k \end{bmatrix} + q_k \quad (1)$$

Subscript k indicates time points. For example, $(x_{k+1}, y_{k+1}, \theta_{k+1}, v_{k+1}, \omega_{k+1})$ that is a left side of equation (1) shows the state quantities of the vehicle at a time point k+1. In equation (1), $q_k$ of a second term in a right side is system noise (average 0, normal distribution N (0, $Q_k$) having $Q_k$ that is an error covariance matrix). The error covariance matrix refers to a matrix of variance and covariance.

In the present embodiment, the observation unit 21 observes the speed of the vehicle, the angular speed of the vehicle, the acceleration of the vehicle, the position of the vehicle, and the azimuth of the vehicle, as the observation targets. As described above, the observation unit 21 observes the speed of the vehicle based on the output from the vehicle speed sensor 6. Further, the observation unit 21 observes the angular speed of the vehicle based on the output from the gyro sensor 7. Further, the observation unit 21 observes the acceleration of the vehicle based on the output from the acceleration sensor 8. Further, the observation unit 21 observes the position of the vehicle and the azimuth of the vehicle based on the outputs from the GPS reception unit 5. Hereinafter, observation targets that are observed by the observation unit 21 will be shown. Note that the speed of the vehicle, the angular speed of the vehicle, the position of the vehicle and the azimuth of the vehicle will be illustrated as the observation targets below.

$v_k^{PLS}$: speed of the vehicle observed based on the output from the vehicle speed sensor 6

$\omega_k^{GYR}$: angular speed of the vehicle observed based on the output from the gyro sensor 7

$x_k^{GPS}$: x-coordinate of the vehicle position observed based on the output from the GPS reception unit 5

$y_k^{GPS}$: y-coordinate of the vehicle position observed based on the output from the GPS reception unit 5

$\theta_k^{GPS}$: azimuth of the vehicle observed based on the output from the GPS reception unit 5

Here, when the observation vectors expressing the above described observation target by vectors are ($v^{PLS}$, $\omega^{GYR}$, $x^{GPS}$, $y^{GPS}$, $\theta^{GPS}$) an observation equation about the observation target is expressed by equation (2).

[Expression 2]

$$\begin{bmatrix} v_k^{PLS} \\ \omega_k^{GYR} \\ x_k^{GPS} \\ y_k^{GPS} \\ \theta_k^{GPS} \end{bmatrix} = \begin{bmatrix} v_{k+1} \\ \omega_{k+1} \\ x_{k+1} \\ y_{k+1} \\ \theta_{k+1} \end{bmatrix} + r_k \quad (2)$$

In equation (2), $r_k$ represents observation noise (a normal distribution N (0, $R_k$) having $R_k$ that is an error covariance matrix, with an average of 0).

Hereinafter, a Kalman filter will be explained by being divided into prediction processing of predicting the state quantities of a vehicle, and estimation processing of estimating the state quantities of the vehicle.

Note that in the following explanation, a value assigned with a subscript k+1|k represents a prediction value at a time point k+1, which is predicted based on information up to a time point k. Further, a value assigned with a subscript k|k−1 represents a prediction value at a time point k, which is predicted based on information up to a time point k−1. Further, a value assigned with a subscript k+1|k+1 indicates an estimation value at a time point k+1 estimated based on the information up to the time point k+1. Further, a value assigned with a subscript k|k indicates an estimation value at the time point k that is estimated based on the information up to the time point k. Further, a value assigned with a subscript k−1|k−1 indicates an estimation value at the time point k−1 that is estimated based on the information up to the time point k−1.

<Prediction Processing>

In a Kalman filter, the prediction processing is processing of calculating prediction values (hereinafter, expressed as "vehicle state prediction values") of state quantities of a vehicle, and an error covariance matrix of the vehicle state prediction values. The vehicle state prediction values are calculated based on equation (3). Note that calculation of the error covariance matrix refers to calculation of values of respective components of the error covariance matrix.

[Expression 3]

$$\begin{bmatrix} x_{k+1|k} \\ y_{k+1|k} \\ \theta_{k+1|k} \\ v_{k+1|k} \\ \omega_{k+1|k} \end{bmatrix} = \begin{bmatrix} x_{k|k} + \cos(\theta_{k|k})v_{k|k}T \\ y_{k|k} + \sin(\theta_{k|k})v_{k|k}T \\ \theta_{k|k} + \omega_{k|k}T \\ v_{k|k} \\ \omega_{k|k} \end{bmatrix} \quad (3)$$

Equation (3) shows calculation of the vehicle state prediction values at the time point k+1, which are predicted based on the information up to the time point k. The vehicle state prediction values are calculated by the estimation values of the state quantities of the vehicle at the time point k, which are estimated based on the information up to the time point k, as shown in a right side of equation (3). For example, $x_{k+1|k}$ indicating a prediction value of the x-coordinate of the position of the vehicle is calculated based on an estimation value of an x-coordinate ($x_{k|k}$) of the position of the vehicle, an estimation value of an azimuth ($\theta_{k|k}$) of the vehicle and an estimation value of a speed ($v_{k|k}$) of the vehicle, at the time point k, which are estimated based on the information up to the time point k. Note that in equation (3), T represents an interval at which the observation unit 21 observes each of the observables based on outputs from the vehicle speed sensor 6, the gyro sensor 7 and the acceleration sensor 8.

Note that when the vehicle state prediction values at the time point k, which are predicted based on information up to a time point k−1 are calculated, the vehicle state prediction values can be calculated by an equation in which the time points in equation (3) are each reduced by one step. That is, the vehicle state prediction values at the time point k, which are predicted based on the information up to the time point k−1 are calculated based on estimation values of the state quantities of the vehicle at the time point k−1, which are estimated based on the information up to the time point k−1.

The error covariance matrix of the vehicle state prediction values are calculated based on equation (4). The error covariance matrix is a matrix of variance and covariance concerning the state quantities of the vehicle in the present embodiment. Variance is obtained by squaring an error. That is, variance of the state quantities of the vehicle is a result of squaring errors of the state quantities of the vehicle. Accordingly, calculating the error covariance matrix of the vehicle state prediction values corresponds to calculating errors of the vehicle state prediction values.

[Expression 4]

$$P_{(k+1|k)} = F_{(k)} P_{(k|k)} F^T_{(k)} + Q \quad (4)$$

In equation (4), P represents the error covariance matrix. A left side of equation (4) shows the error covariance matrix at the time point k+1, which is predicted based on the information up to the time point k. The error covariance matrix shown in the left side of equation (4) is calculated based on the error covariance matrix at the time point k, which is estimated based on the information up to the time point k. Note that F represents a Jacobi matrix obtained from a state equation of equation (1). Further, a superscript T in F represents a transposed matrix. Further, Q represents an error covariance matrix of system noise.

Note that when the error covariance matrix of the vehicle state prediction values at the time point k which are predicted based on the information up to the time point k−1 are calculated, the error covariance matrix can be calculated by an equation in which the time points of the subscripts of P in equation (4) are each reduced by one step. That is, the error covariance matrix of the vehicle state prediction values at the time point k, which are predicted based on the information up to the time point k−1, is calculated based on the error covariance matrix of the estimation values of the state quantities of the vehicle at the time point k−1, which are estimated based on the information up to the time point k−1.

In this way, in the prediction processing, in the case of predicting the state quantities of the vehicle at the time point k, for example, the vehicle state prediction values at the time point k, which are calculated based on the information up to the time point k−1, and the error covariance matrix of the vehicle state prediction values at the time point k, which are calculated based on the information up to the time point k−1, are calculated. That is, the prediction processing predicts probability distribution of the state quantities of the vehicle.

<Estimation Processing>

Next, estimation processing will be described.

The estimation processing in a Kalman filter is processing of calculating estimation values of the state quantities of the vehicle (hereinafter, expressed as "vehicle state estimation values"), and an error covariance matrix of the vehicle state estimation values, based on the vehicle state prediction values calculated in the prediction processing, and the error covariance matrix of the vehicle state prediction values.

In the estimation processing, observation residual errors are calculated by equation (5). The observation residual errors refer to errors between values of observation targets, and values corresponding to the observation targets calculated from the vehicle state prediction values.

[Expression 5]

$$\begin{pmatrix} e_k^v \\ e_k^\omega \\ e_k^x \\ e_k^y \\ e_k^\theta \end{pmatrix} = \begin{bmatrix} v_k^{PLS} \\ \omega_k^{GYR} \\ x_k^{GPS} \\ y_k^{GPS} \\ \theta_k^{GPS} \end{bmatrix} - H \begin{bmatrix} x_k \\ y_k \\ \theta_k \\ v_k \\ \omega_k \end{bmatrix} \quad (5)$$

In equation (5), a left side represents observation residual error vectors expressing observation residual errors by vectors. Further, in equation (5), a first term in a right side shows observation target vectors that are the observation targets of the observation unit 21. Further, in equation (5), a second term in the right side is a result of multiplying the vehicle state prediction values predicted in the prediction processing by H that is an observation matrix obtained from an observation equation.

The vehicle state estimation values are calculated by equation (6) by using the observation residual errors shown in equation (5).

[Expression 6]

$$\begin{bmatrix} x_{k+1|k+1} \\ y_{k+1|k+1} \\ \theta_{k+1|k+1} \\ v_{k+1|k+1} \\ \omega_{k+1|k+1} \end{bmatrix} = \begin{bmatrix} x_{k+1|k} \\ y_{k+1|k} \\ \theta_{k+1|k} \\ v_{k+1|k} \\ \omega_{k+1|k} \end{bmatrix} + K_k \begin{pmatrix} e_k^v \\ e_k^\omega \\ e_k^x \\ e_k^y \\ e_k^\theta \end{pmatrix} \quad (6)$$

Equation (6) shows vehicle state estimation values at the time point k+1, which are predicted based on the information up to the time point k+1. The vehicle state estimation values are calculated by correcting the vehicle state prediction values at the time point k+1, which are estimated based on the information up to the time point k, by the observation residual errors, as shown in the right side of equation (6). Note that when the vehicle state estimation values at the time point k, which are predicted based on the information up to the time point k, are calculated, the vehicle state estimation values at the time point k are calculated by correcting the vehicle state prediction values at the time point k which are predicted based on the information up to the time point k−1 by the observation residual errors.

As described above, equation (6) shows an equation calculating the vehicle state estimation values by correcting the vehicle state prediction values by using the observation residual errors. As shown in equation (6), $K_k$ is used as a correction coefficient at the time of correcting the vehicle state prediction values by the observation residual errors. The correction coefficient $K_k$ is called a Kalman gain, and is expressed by equation (7).

[Expression 7]

$$K_k = P_{(k+1|k)} H^T (R_k = H P_{(k+1|k)} H^T)^{-1} \quad (7)$$

In equation (7), Rk represents an error covariance matrix of observation noise. Further, "−1" which is a subscript indicates an inverse matrix. A Kalman gain Kk shown in equation (7) is calculated based on the error covariance matrix of the vehicle state prediction values at the time point k+1 based on the information up to the time point k.

In equation (6), the Kalman gain Kk is a coefficient for deciding whether to calculate the vehicle state estimation values by attaching great importance to the vehicle state prediction values, or to calculate the vehicle state estimation values by attaching great importance to the values of the observation targets observed by the observation unit 21.

For example, when errors of the values of the observation targets based on the outputs from the vehicle speed sensor 6, the gyro sensor 7 and the GPS reception unit 5 are sufficiently small, the vehicle state estimation values are desirably the values of the observation targets, because the errors are sufficiently small. This is because the vehicle state estimation values become values having sufficiently small errors, in other words, values with high precision. That is, when the value of Rk that is the error covariance matrix is sufficiently small, the vehicle state estimation values desirably become the values of the observation targets. Here, when the Kalman gain Kk in the case of the value of Rk being sufficiently small is set as Kk=H−1, and is given to equation (6), a first term in the right side of equation (6) is eliminated. That is, the vehicle state estimation values become values of the observation targets having sufficiently small errors.

Further, for example, when the errors of the vehicle state prediction values are sufficiently smaller than the errors of the observation targets based on the outputs from the vehicle speed sensor 6, the gyro sensor 7 and the GPS reception unit 5, the vehicle state estimation values desirably become the vehicle state prediction values. This is because the vehicle state estimation values become values having sufficiently smaller errors than the errors of the observation targets, in other words, the values with high precision. That is, when the error covariance matrix of the vehicle state prediction values is sufficiently smaller than the value of Rk, the vehicle state estimation values desirably become the vehicle state prediction values. Here, when the Kalman gain Kk in the case of the error covariance matrix of the vehicle state prediction values being sufficiently smaller than the value of Rk is set as Kk=0, and is given to equation (6), the vehicle state estimation values become the vehicle state prediction values.

In this way, the Kalman gain Kk is a coefficient that is set so that the vehicle state estimation values become proper values in accordance with Rk that is the error covariance matrix of the observation noise, and the error covariance matrix of the vehicle state prediction values. That is, when the error covariance matrix of the observation noise is the error covariance matrix of the observation targets, the Kalman gain Kk is set so that the vehicle state estimation values become suitable values in accordance with the error covariance matrix of the observation targets based on the outputs from the vehicle speed sensor 6, the gyro sensor 7 and the GPS reception unit 5, if the error covariance matrix of the vehicle state prediction values is accurately predicted.

The error covariance matrix of the vehicle state estimation values is calculated by equation (8). As described above, the error covariance matrix is a matrix of variance and covariance, concerning the state quantities of the vehicle, in the present embodiment. Variance of the state quantities of the vehicle is a result of squaring the errors of the state quantities of the vehicle. Accordingly, calculating the error covariance matrix of the vehicle state estimation values corresponds to calculating the errors of the vehicle state estimation values.

[Expression 8]

$$P_{k+1|k+1} = (I - K_k H) P_{k+1|k} \quad (8)$$

In equation (8), P represents the error covariance matrix as in equation (4). Further, in equation (8), I represents a unit matrix. A left side of equation (8) shows the error covariance matrix at the time point k+1, which is estimated based on the information up to the time point k+1. The error covariance matrix shown in the left side of equation (8) is calculated based on the error covariance matrix at the time point k+1, which is predicted based on the information up to the time point k.

Note that when the error covariance matrix of the vehicle state estimation values at the time point k, predicted based on the information up to the time point k is calculated, the error covariance matrix of the vehicle state estimation values can be calculated by equation in which the time point of the subscript of P is reduced by one step in equation (8). That is, the error covariance matrix of the vehicle state estimation values at the time point k, which are predicted based on the information up to the time point k is calculated by the error covariance matrix of the vehicle state prediction values at the time point k, which are estimated based on the information up to the time point k−1.

Equation (8), the error covariance matrix of the vehicle state estimation values, is an equation in which the error covariance matrix of the vehicle state prediction values is multiplied by $(I-K_k H)$. As shown in equation (8), the error covariance matrix of the vehicle state estimation values depends on the value of the Kalman gain $K_k$.

For example, when $K_k = H-1$ is given to equation (8) as the Kalman gain $K_k$ in the case of the errors of the observables being sufficiently small, the error covariance matrix of the vehicle state estimation values becomes a zero matrix. This indicates that the errors of the vehicle state estimation values that are estimated are sufficiently small.

Further, by giving $K_k = 0$ as the value of the Kalman gain in the case of the errors of the vehicle state prediction values being sufficiently smaller than the errors of the observation noise, the error covariance matrix of the vehicle state estimation values becomes the error covariance matrix of the vehicle state prediction values. This indicates that the errors of the vehicle state estimation values are errors of the vehicle state prediction values that are sufficiently small.

In this way, the Kalman gain $K_k$ is set so that the error covariance matrix of the vehicle state estimation values becomes suitable, in accordance with the error covariance matrix of the observation noise and the error covariance matrix of the vehicle state prediction values, in equation (8). That is, the Kalman gain $K_k$ is set so that the error covariance matrix of the vehicle state estimation values becomes suitable based on precision of the observation noise and precision of the vehicle state prediction values.

As above, in the estimation processing, in the case of estimating the state quantities of the vehicle at the time point k, for example, the vehicle state estimation values at the time point k which are calculated based on the information up to the time point k, and the error covariance matrix of the vehicle state estimation values at the time point k which are calculated based on the information up to the time point k are calculated. That is, the estimation processing estimates probability distributions of the state quantities of the vehicle based on the probability distributions of the state quantities of the vehicle predicted in the prediction processing.

From the above calculation, the estimation unit 22 estimates the state of the vehicle by calculating the vehicle state estimation values, and the error covariance matrix of the vehicle state estimation values by the Kalman filter.

As described above, the Kalman gain Kk is a coefficient for properly setting the vehicle state estimation values and the error covariance matrix of the vehicle state estimation values. That is, precision of estimation of the state of the vehicle depends on the Kalman gain Kk. The Kalman gain Kk is the coefficient for properly setting the vehicle state estimation values and the error covariance matrix of the vehicle state estimation values in accordance with the observation noise, and the error covariance matrix of the vehicle state prediction values as described above. Therefore, in order to properly calculate the vehicle state estimation values and the error covariance matrix of the vehicle state estimation values, the error covariance matrix of the vehicle state prediction values needs to be accurately calculated. However, in the Kalman filter, it is assumed that the system noise, and observation noise are white noise. That is, when errors are dealt with as noise in the Kalman filter, it is the precondition that the average of the errors is zero. Consequently, the error covariance matrix of the vehicle state prediction values cannot be sometimes calculated with the errors the average of which is not zero, that is, the accumulating error taken into consideration, and in this case, the Kalman gain Kk is not accurately calculated. This indicates that the vehicle state estimation values and the error covariance matrix of the vehicle state estimation values cannot be calculated precisely, that is, the state of the vehicle cannot be estimated precisely.

Thus, the estimation unit 22 of the present embodiment estimates the state of the vehicle by the Kalman filter as follows.

Hereinafter, estimation of the state of the vehicle by the estimation unit 22 will be described through an operation of the navigation system 1 at the time of estimating the state of the vehicle.

FIG. 2 is a flowchart illustrating the operation of the navigation system 1.

The observation unit 21 of the navigation system 1 observes the speed of the vehicle, the angular speed of the vehicle and the acceleration of the vehicle based on the signals outputted from the vehicle speed sensor 6, the gyro sensor 7 and the acceleration sensor 8 (step SA1). The observation unit 21 observes the speed of the vehicle, the angular speed of the vehicle and the acceleration of the vehicle every time the vehicle speed sensor 6, the gyro sensor 7 and the acceleration sensor 8 output signals. That is, the intervals at which the observation unit 21 observes them are the same intervals at which the vehicle speed sensor 6, the gyro sensor 7, and the acceleration sensor 8 perform detection.

[Expression 10]

$$F_k = \begin{bmatrix} 1 & 0 & -\sin(\theta_{k|k})v_k T & \cos(\theta_{k|k})T & 0 \\ 0 & 1 & \cos(\theta_{k|k})v_k T & \sin(\theta_{k|k})T & 0 \\ 0 & 0 & 1 & 0 & T \\ 0 & 0 & 0 & 1 & 0 \\ 0 & 0 & 0 & 0 & 1 \end{bmatrix} \quad (10)$$

[Expression 11]

$$Q_k = \begin{bmatrix} q_k^{11} & q_k^{12} & q_k^{13} & q_k^{14} & q_k^{15} \\ q_k^{21} & q_k^{22} & q_k^{23} & q_k^{24} & q_k^{25} \\ q_k^{31} & q_k^{32} & q_k^{33} & q_k^{34} & q_k^{35} \\ q_k^{41} & q_k^{42} & q_k^{43} & q_k^{44} & q_k^{45} \\ q_k^{51} & q_k^{52} & q_k^{53} & q_k^{54} & q_k^{55} \end{bmatrix} \quad (11)$$

[Expression 12]

$$C_k = \begin{bmatrix} \sqrt{P_k^{11}} (\cos(\theta_{k|k})\sigma_k^{\omega PLS} T) & 0 & 0 & 0 & 0 \\ 0 & \sqrt{P_k^{22}} (\cos(\theta_{k|k})\sigma_k^{\omega PLS} T) & 0 & 0 & 0 \\ 0 & 0 & \sqrt{P_k^{33}} (\sigma_k^{\omega GFR} T) & 0 & 0 \\ 0 & 0 & 0 & 0 & 0 \\ 0 & 0 & 0 & 0 & 0 \end{bmatrix} \quad (12)$$

Next, based on the outputs of the GPS reception unit 5, the observation unit 21 observes the vehicle position, and the azimuth of the vehicle (step SA2). Every time the information indicating the vehicle position and the information indicating the azimuth of the vehicle are outputted from the GPS reception unit 5, the observation unit 21 observes the vehicle position and the azimuth of the vehicle. That is, intervals at which the observation unit 21 observes the vehicle position and the azimuth of the vehicle are intervals at which the GPS reception unit 5 receives the GPS radio waves.

Next, the estimation unit 22 of the navigation system 1 executes the vehicle state estimation processing of estimating the state of the vehicle based on the observables observed by the observation unit 21 (step SA3).

FIG. 3 is a flowchart illustrating the operation of the estimation unit 22 in the vehicle state estimation processing.

The estimation unit 22 executes prediction processing (step SB1). As described above, the prediction processing is processing of calculating the vehicle state prediction values, and the error covariance matrix of the vehicle state prediction values. The vehicle state prediction values are calculated by equation (3). The error covariance matrix of the vehicle state prediction values is calculated by equation (9).

[Expression 9]

$$P_{k+1|k} = F_k P_{k|k} F_k^T + Q_k + 2 \cdot C_k \quad (9)$$

In equation (9), Fk represents a Jacobi matrix obtained from the state equation of equation (1), and is expressed by equation (10). Further, Qk represents the error covariance matrix of the system noise, and is expressed by equation (11). Further, Ck represents the covariance matrix of errors of the vehicle state estimation values estimated at a previous time, and errors of the observables which the observation unit 21 observes based on the outputs from the vehicle speed sensor 6 and the gyro sensor 7, and is expressed by equation (12). Qk+2·Ck represents the system noise.

In equation (12), σkvPLS represents an error of the speed of the vehicle calculated by the observation unit 21. Further, σkωGYR represents an error of the angular speed of the vehicle calculated by the observation unit 21. As described above, σkvPLS is the error accumulating in the moving distance that is obtained from the speed with the lapse of time. Further, σkωGYR is the error accumulating in the azimuth change amount that is obtained from the angular speed, with time, similarly to σkvPLS.

As illustrated in equation (12), in equation (9) for calculating the error covariance matrix of the vehicle state prediction value, the error of the speed of the vehicle which is calculated by the observation unit 21 based on the output from the vehicle speed sensor 6 is inputted as the error of the position of the vehicle. That is, σkvPLS is inputted as cos(θk|k)σkvPLST, and sin(θk|k)σkvPLST. Further, the error of the angular speed of the vehicle which is calculated by the observation unit 21 based on the output from the gyro sensor 7 is inputted as the error of the azimuth of the vehicle. That is, σkωGYR is inputted as σkωGYRT.

In this way, the estimation unit 22 calculates the error covariance matrix of the vehicle state prediction values, by the Kalman filter to which σkvPLS is inputted as the error of the position of the vehicle, and σkωGYR is inputted as the error of the azimuth of the vehicle, with respect to the errors which accumulate with the lapse of time, that is, σkvPLS and σkωGYR.

Here, inputting σkvPLS to the Kalman filter as the error of the position of the vehicle, and inputting σkωGYR as the error of the azimuth of the vehicle will be described. Hereinafter, inputting σkvPLS to the Kalman filter as the error of the position of the vehicle will be described in detail.

Here, for convenience of explanation, the state quantities of the vehicle are illustrated as an x-coordinate of the position of the vehicle and the speed of the vehicle, and inputting σkvPLS to the Kalman filter as the error of the position of the vehicle will be described. In this example, the x-coordinate of the position of the vehicle is determined by the speed of the vehicle. In this example, the observation target is the speed of the vehicle.

Accordingly, a state equation for the state quantities of the vehicle is expressed by equation (13). Further, an observation equation for the observation target is expressed by equation (14).

[Expression 13]

$$\begin{bmatrix} x_{k+1} \\ v_{k+1} \end{bmatrix} = \begin{bmatrix} x_k + Tv_k \\ v_k \end{bmatrix} + Q = \begin{bmatrix} 1 & T \\ 0 & 1 \end{bmatrix}\begin{bmatrix} x_k \\ v_k \end{bmatrix} + Q \quad (13)$$

[Expression 14]

$$V = \begin{bmatrix} 0 & 1 \end{bmatrix}\begin{bmatrix} x_{k+1} \\ v_{k+1} \end{bmatrix} + R \quad (14)$$

Based on equation (13) and equation (14), the error covariance matrix of the vehicle state estimation values at the time point k which are estimated based on the information up to the time point k is calculated based on equation (4), equation (6) and equation (8). Here, in calculating the error covariance matrix of the vehicle state estimation values, P(k|k) is expressed by equation (15). P(k|k) is the error covariance matrix of the vehicle state estimation values at the time point k which are estimated based on the information up to the time point k.

[Expression 15]

$$p_{(k|k)} = \begin{bmatrix} p_{11}^{(k|k)} & p_{12}^{(k|k)} \\ p_{12}^{(k|k)} & p_{22}^{(k|k)} \end{bmatrix} \quad (15)$$

In equation (15), P11(k|k) represents error variance of the position of the vehicle. Further, p22(k|k) represents error variance of the speed of the vehicle. Further, p12(k|k) represents error covariance of the position of the vehicle and the speed of the vehicle.

Further, in calculating the error covariance matrix of the vehicle state estimation values, F, Q, H and R are respectively expressed by equation (16) to equation (19). Here, F represents a Jacobi matrix obtained from the state equation. Further, Q represents a variance matrix of the system noise. Further, H represents a Jacobi matrix obtained from the observation equation. Further, R represents a variance matrix of the observation noise. Since the observable is the speed of the vehicle, rk is the error of the speed of the vehicle. That is, rk2 represents the error variance of the speed of the vehicle observed by the observation unit 21.

[Expression 16]

$$F = \begin{bmatrix} 1 & T \\ 0 & 1 \end{bmatrix} \quad (16)$$

[Expression 17]

$$Q = \begin{bmatrix} q_x^2 & 0 \\ 0 & q_v^2 \end{bmatrix} \quad (17)$$

[Expression 18]

$$H = \begin{bmatrix} 0 & 1 \end{bmatrix} \quad (18)$$

[Expression 19]

$$R_{(k)} = [r_k^2] \quad (19)$$

When the error covariance matrix of the vehicle state estimation value, that is, P(k|k) is calculated based on equation (15) to equation (19), the error covariance matrix of the vehicle state estimation value is expressed by equation (20).

[Expression 20]

$$P_{(k|k)} = (I - K_{(k)}H_{(k)})P_{(k|k-1)} = \quad (20)$$

$$\begin{bmatrix} P_{11}^{(k|k-1)} - \frac{\left(P_{12}^{(k|k-1)}\right)^2}{\left(P_{22}^{(k|k-1)} + r_k^2\right)} & P_{12}^{(k|k-1)} - \frac{P_{12}^{(k|k-1)}P_{22}^{(k|k-1)}}{\left(P_{22}^{(k|k-1)} + r_k^2\right)} \\ P_{12}^{(k|k-1)} - \frac{P_{12}^{(k|k-1)}P_{22}^{(k|k-1)}}{\left(P_{22}^{(k|k-1)} + r_k^2\right)} & P_{22}^{(k|k-1)} - \frac{\left(P_{22}^{(k|k-1)}\right)^2}{\left(P_{22}^{(k|k-1)} + r_k^2\right)} \end{bmatrix}$$

Accordingly, the error variance of the estimation value of the position of the vehicle is expressed by equation (21).

[Expression 21]

$$P_{11}^{(k|k)} = P_{11}^{(k|k-1)} - \frac{\left(P_{12}^{(k|k-1)}\right)^2}{\left(P_{22}^{(k|k-1)} + r_k^2\right)} \quad (21)$$

Equation (21) is modified to equation (22) when p11(k|k−1) that is a common factor is taken out. p11(k|k−1) represents the error variance of the prediction value of the position of the vehicle at the time point k based on the information up to the time point k−1.

[Expression 22]

$$P_{11}^{(k|k)} = \left\{1 - \frac{\left(P_{12}^{(k|k-1)}\right)^2}{\left(P_{22}^{(k|k-1)} + r_k^2\right)\left(P_{11}^{(k|k-1)}\right)}\right\}\left(P_{11}^{(k|k-1)}\right) \quad (22)$$

As shown in equation (22), p11(k|k) that is the error covariance of the estimation value of the position of the vehicle is obtained by multiplying p11(k|k−1) that is the error variance of the prediction value of the position of the vehicle by equation (23).

[Expression 23]

$$\left\{1 - \frac{\left(P_{12}^{(k|k-1)}\right)^2}{\left(P_{22}^{(k|k-1)} + r_k^2\right)\left(P_{11}^{(k|k-1)}\right)}\right\} \quad (23)$$

Equation (23) is a coefficient by which p11(k|k−1) that is variance of the prediction value of the position of the vehicle is multiplied, as shown in equation (22). The coefficient corresponds to equation (24) except that the error (rk) of the speed of the vehicle is included in a denominator.

[Expression 24]

$$\left\{1 - \left[\frac{\text{Covariance of error of position of vehicle}}{\text{(Error of position of vehicle)}}\right]^2\right\} \quad (24)$$

A coefficient shown in equation (24) is "1—(a correlation coefficient of the error of the position of the vehicle and the error of the speed of the vehicle)2". This indicates that the coefficient shown in equation (24) is a nondeterministic coefficient of a linear regression model using a least squares method. That is, as correlativity of the error of the position of the vehicle and the error of the speed of the vehicle is smaller, the coefficient has a larger value, and variance of the prediction value of the position of the vehicle has a larger value. On the other hand, as the correlativity is larger, the coefficient has a smaller value, and variance of the prediction value of the position of the vehicle has a smaller value. Further, equation (22) indicates that variance of the estimation value of the position of the vehicle exponentially decreases with respect to the error of the speed of the vehicle.

Accordingly, it is shown that the error variance of the estimation value of the position of the vehicle is determined based on the correlativity of the error of the position of the vehicle and the error of the speed of the vehicle. Further, it is also shown that the error of the estimation value of the position of the vehicle does not accumulate by the error of the speed of the vehicle. That is, in order to accumulate p11(k|k) that is the error variance of the estimation value of the position of the vehicle, with accumulation of the error of the speed of the vehicle, it is necessary to decrease the correlativity of the error of the position of the vehicle and the error of the speed of the vehicle. That is, in order to accumulate p11(k|k), it is necessary to decrease the correlativity of the error of the position of the vehicle and the error of the speed of the vehicle in the Kalman filter. More specifically, concerning the error of the speed which accumulates in the moving distance, it is necessary to input the error of the speed of the vehicle to the Kalman filter, as the error of the position of the vehicle, and estimate the error of the position of the vehicle, instead of inputting the error of the speed of the vehicle to the Kalman filter and estimating the error of the position of the vehicle.

Accordingly, as shown in equation (12), concerning the error of the speed that accumulates in the moving distance, the error of the speed of the vehicle is inputted to the Kalman filter as the error of the position of the vehicle that is in a relation of calculus with the speed of the vehicle. Thereby, the correlativity of the error of the speed of the vehicle and the error of the position of the vehicle can be decreased by the amount of the error of the speed that accumulates in the moving distance, and the error covariance matrix of the prediction value of the position of the vehicle can be calculated with the error of the speed of the vehicle which accumulates as the error of the position of the vehicle which accumulates. That is, the error covariance matrix of the prediction value of the position of the vehicle with the error of the speed of the vehicle which accumulates taken into consideration can be calculated.

However, when the error of the speed of the vehicle is inputted to the Kalman filter as the error of the position of the vehicle, equation (4) cannot be directly used.

In equation (4), the first term in the right side is a result of transforming the error covariance matrix of the vehicle state estimation values estimated at a previous time into the error covariance matrix of the state quantities of the vehicle of this time by the Jacob matrix obtained from the state equation. On the other hand, the second term in the right side is the error covariance matrix of the system noise. That is, equation (4) is an equation for calculating the error covariance matrix of the vehicle state prediction values by adding the error covariance matrix of the system noise to a result of transforming the error covariance matrix of the vehicle state estimation values of the previous time into the error covariance matrix of the vehicle state estimation values of this time. Here, in equation (4), a proposition shown in equation (25) is used.

[Expression 25]

$$\text{Var}(X+Y)=\text{Var}(X)+\text{Var}(Y) \quad (25)$$

Equation (25) shows an equation that is established with respect to variance Var ( ) when a random variable X and a random variable Y are independent from each other. That is, equation (4) that is used in calculating the error covariance matrix of the vehicle state prediction values in the Kalman filter is on the precondition that the error covariance matrix of the state quantities of the vehicle, and the error covariance matrix of the system noise are independent from each other. However, when the error covariance matrix of the system noise is used as the error covariance matrix of the error which accumulates, the error covariance matrix of the vehicle state prediction value cannot be accurately calculated with equation (4). This is because the error covariance matrix of the state quantities of the vehicle, and the error covariance matrix of the accumulating error inputted as the state quantities of the vehicle are not independent from each other. For example, the error of the position of the vehicle is determined by the error of the speed which accumulates with the lapse of time, so that the error of the position of the vehicle, and the error of the speed of the vehicle are variables that change in such a manner that one changes with change of the other, that is, variables that are not independent from each other. Therefore, it is necessary to use a proposition that is established when the random variable X and the random variable Y are not independent from each other. The proposition is expressed by equation (26).

[Expression 26]

$$\text{Var}(X+Y)=\text{Var}(X)+\text{Var}(Y)+2\text{Cov}(X,Y) \quad (26)$$

In equation (26), Cov ( ) represents covariance. Accordingly, as compared with equation (24), covariance of the random variable X and the random variable Y is inputted to equation (26).

By using equation (9) according to equation (26), independency of the error covariance matrix of the state quantities of the vehicle and the error covariance matrix of the accumulating error is eliminated, and the error covariance matrix of the vehicle state prediction values can be accurately calculated.

Inputting the error of the speed of the vehicle to the Kalman filter as the error of the position of the vehicle is described above. Explanation of inputting the error of the angular speed to the Kalman filter as the error of the azimuth can be similarly made.

As the above explanation, the error covariance matrix of the vehicle state prediction value with the accumulating error taken into consideration can be calculated by the equation in which the error of the observable is inputted as the error of the state quantity in relation of calculus with the observable, and no independency is present between the error of the observable and the error of the state quantity of the vehicle.

Returning to explanation of the flowchart illustrated in FIG. 3, the estimation unit 22 executes estimation processing after executing the prediction processing. The estimation unit 22 calculates the vehicle state estimation value, and the error covariance matrix of the vehicle state estimation value, based on equation (5) to equation (8).

As described above, the Kalman gain Kk is the coefficient that properly sets the vehicle state estimation values and the error covariance matrix of the vehicle state estimation values in accordance with the error covariance matrix of the observation noise and the error covariance matrix of the vehicle prediction value. In the prediction processing, the estimation unit 22 can calculate the error covariance matrix of the vehicle state prediction value with the accumulating error taken into consideration, and therefore can accurately calculate the Kalman gain Kk. Accordingly, the estimation unit 22 can precisely calculate the vehicle state estimation values and the errors of the vehicle state estimation values.

Further, as shown in equation (8), the error covariance matrix of the vehicle state estimation values is calculated by multiplying the error covariance matrix of the vehicle state prediction values by (I-KkH). Accordingly, since the error covariance matrix of the vehicle state prediction values is the error covariance matrix with accumulating errors taken into consideration, so that the error covariance matrix of the vehicle state estimation values which is calculated is also the error covariance matrix with the accumulating errors taken into consideration.

In this way, the estimation unit 22 can calculate the error covariance matrix of the vehicle state prediction values with the accumulating errors taken into consideration, so that the estimation unit 22 can calculate the Kalman gain Kk accurately and can estimate the state of the vehicle precisely by the Kalman filter.

Further, the state of the vehicle is estimated by the Kalman filter, so that as compared with the configuration in which the state of the vehicle is estimated based on the Kalman filter in which the error is the target of estimation, the state of the vehicle does not have to be estimated separately from the error, and the state of the vehicle with the accumulating error taken into consideration can be easily estimated.

Note that when the speed of the vehicle is estimated as the state quantity, the estimation unit 22 may be configured to calculate the error covariance matrix of the prediction value of the speed of the vehicle based on the Kalman filter to which the error of the acceleration of the vehicle is inputted as the error of the speed of the vehicle and estimate the speed of the vehicle. Thereby, the error covariance matrix of the prediction value of the speed of the vehicle with the error of the acceleration which accumulates taken into consideration is calculated, so that the Kalman gain Kk can be accurately calculated, and the speed of the vehicle can be precisely estimated by the Kalman filter.

As described above, the estimation unit 22 is configured to calculate the vehicle state estimation value and the error covariance matrix of the vehicle state estimation value by taking into account the position of the vehicle and the azimuth of the vehicle observed by the observation unit 21, based on the information indicating the position of the vehicle and the information indicating the azimuth of the vehicle which are outputted by the GPS reception unit 5, and estimate the state of the vehicle. However, the estimation unit 22 is not limited to the configuration in which the estimation unit 22 estimates the state of the vehicle by taking into account the position of the vehicle and the azimuth of the vehicle observed by the observation unit 21. That is, the estimation unit 22 may estimate the state of the vehicle without being based on the output from the GPS reception unit 5.

For example, when the vehicle is under the environment where the vehicle cannot receive GPS radio waves by the GPS reception unit 5, the estimation unit 22 estimates the state quantities of the vehicle based on the observation equation having no components of the position of the vehicle and the azimuth of the vehicle based on the output from the GPS reception unit 5.

As shown in equation (12), the estimation unit 22 calculates the error covariance matrix of the vehicle state prediction values based on intervals of signals outputted from the vehicle speed sensor 6 and the gyro sensor 7 when calculating the error covariance matrix of the vehicle state prediction values. Further, the estimation unit 22 calculates the vehicle state prediction values based on the vehicle state estimation values which is estimated at the previous time and the intervals, as shown in equation (3). Accordingly, the estimation unit 22 does not depend on the reception interval of the GPS reception unit 5 when calculating the vehicle state prediction values, and the error covariance matrix of the vehicle state prediction values. Accordingly, the estimation unit 22 can calculate the vehicle state estimation values and the error covariance matrix of the vehicle state estimation values by being based on the equation having no components of the observation targets based on the output from the GPS reception unit 5, in equation (5).

That is, the estimation unit 22 can estimate the state of the vehicle without depending on the interval of reception of the GPS radio waves of the GPS reception unit 5. This indicates that the estimation unit 22 estimates the state of the vehicle based on the detection intervals of the vehicle speed sensor 6, the gyro sensor 7 and the acceleration sensor 8. Accordingly, the estimation unit 22 exhibits the following effect when the detection intervals of the vehicle speed sensor 6, the gyro sensor 7 and the acceleration sensor 8 are shorter than the reception interval of the GPS reception unit 5. That is, estimation of the state of the vehicle can be executed at a higher frequency than the configuration in which the state of the vehicle is estimated by the Kalman filter based on the reception interval, and the state of the vehicle can be estimated without depending on the reception environment of the GPS reception unit 5.

As described above, the control unit 2 of the navigation system 1 executes evaluation of the link to be a target of map matching based on the state of the vehicle which is estimated.

FIG. 4 is a diagram illustrating a road R1 and a road R2 on a map to explain processing of map matching based on the state of the vehicle which is estimated. In FIG. 4, the road R1 is a road that extends to a direction Y1. Further, the road R2 is a road that extends to a direction Y2 that is not parallel with the direction Y1.

In FIG. 4, a link L1 is a link corresponding to the road R1. Further, a link L2 is a link corresponding to the road R2.

Further, in FIG. 4, a mark α is a mark indicating the position of the vehicle, which is estimated by the estimation unit 22. Hereinafter, in explanation using FIG. 4, the vehicle is assumed to be estimated as being located in a position M1 and traveling toward a traveling direction X1 by the estimation unit 22. As illustrated in FIG. 4, the position M1 is a position on the road R1, and is a position separated to a right side as seen in the direction Y1, from a center of a width direction of the road R1.

When a relationship among the road R1, the road R2 and the position of the vehicle which is estimated is a relationship illustrated in FIG. 4, the control unit 2 first refers to the map data 3a, at a time of map matching, and acquires a map matching candidate link that is a link to be a candidate of map matching. The control unit 2 acquires one or a plurality of links that is or are located within a predetermined range that is set in advance from the position of the vehicle which is estimated, and has or have errors of the azimuths of the vehicle and link being within the predetermined range, as the map matching candidate link. In the example in FIG. 4, the link L1 and the link L2 are links that are located within a predetermined range from the position M1 which is the estimated position of the vehicle, and have errors of the azimuths of the vehicle and the link within a predetermined range. Consequently, the control unit 2 acquires the link L1 and the link L2 as the map matching candidate links.

Next, the control unit 2 calculates an evaluation amount by which the link is evaluated for each of the acquired map matching candidate links.

The evaluation amount is a value that is calculated by equation (27) shown as follows based on the error of the position of the vehicle which is estimated and the position of the map matching candidate link, and the error of the azimuth of the vehicle which is estimated and an azimuth of the map matching candidate link.

$$\tau = \delta x^2/\Delta x^2 + \delta y^2/\Delta y^2 + \delta \theta^2/\Delta \theta^2 \quad (27)$$

Here, the error of the position of the vehicle which is estimated and the position of the map matching candidate link is a difference in the x-axis direction and the y-axis direction between an intersection point of a perpendicular line in a case where the perpendicular line is extended from the position of the vehicle which is estimated to the map matching candidate link and the map matching candidate link, and the position of the vehicle which is estimated. In equation (27), δx represents a difference between an x-coordinate of the intersection point and an x-coordinate of the position of the vehicle which is estimated. Further, δy represents a difference between a y-coordinate of the intersection point and a y-coordinate of the position of the vehicle which is estimated.

In the example in FIG. 4, an error of the position of the vehicle which is estimated and the position of the link L1 is a difference in the x-axis direction and the y-axis direction between an intersection point MM1 of a perpendicular line S1 that is extended from the position M1 to the link L1 and the link L1, and the position M1. Further, in FIG. 4, an error of the position of the vehicle which is estimated and the position of the link L2 is a difference in the x-axis direction and the y-axis direction between an intersection point MM2 of a perpendicular line S2 that is extended from the position M1 to the link L2 and the link L2, and the position M1.

Further, an error of the azimuth of the vehicle which is estimated, and the azimuth of the map matching candidate link is a difference between an angle corresponding to the azimuth of the vehicle which is estimated, and an angle corresponding to the azimuth of the map matching candidate link.

As described above, the azimuth of the vehicle means a compass bearing of the traveling direction of the vehicle. In the example in FIG. 4, the azimuth of the vehicle which is estimated is a compass bearing of the traveling direction X1. Further, the angle corresponding to the azimuth of the vehicle means a counterclockwise separation angle between a direction to the east and the azimuth of the vehicle, with the direction to the east as a reference. In the example in FIG. 4, the angle corresponding to the azimuth of the vehicle which is estimated is an angle θ1 when a virtual straight line K1 is a virtual straight line extending in an east-west direction.

Further, the azimuth of the link means a compass bearing of a direction in which the link extends. The direction in which the link extends means a direction corresponding to a direction in which the vehicle can travel in a road corresponding to the link, out of the two directions along the link. Further, the angle corresponding to the azimuth of the link means a counterclockwise separation angle between the direction to the east and the azimuth of the link with the direction to the east as the reference.

In the example in FIG. 4, the azimuth of the link L1 is a compass bearing of a direction Z1. Further, an angle corresponding to the azimuth of the link L1 is an angle θ2 when a virtual straight line K2 is a virtual straight line extending in the east-west direction. Further, in the example in FIG. 4, an azimuth of the link L2 is a compass bearing of a direction Z2. Further, an angle corresponding to the azimuth of the link L2 is an angle θ3 when a virtual straight line K3 is a virtual straight line extending in the east-west direction.

In the example in FIG. 4, an azimuth error of the vehicle and the link L1 is a difference between the angle θ1 and the angle θ2. Further, an azimuth error of the vehicle and the link L2 is a difference between the angle θ1 and the angle θ3. That is, in the example in FIG. 4, in equation (27), δθ represents the difference between the angle θ1 and the angle θ2, or the difference between the angle θ1 and the angle θ3.

As shown in equation (27), the estimation amount τ is calculated by a sum of what is obtained by dividing a value obtained by squaring δx by a value obtained by squaring Δx, what is obtained by dividing a value obtained by squaring δy by a value obtained by squaring Δy, and what is obtained by dividing a value obtained by squaring δθ by a value obtained by squaring Δθ. Δx represents the error of the position in the x-axis direction of the vehicle estimated by the estimation unit 22. That is, Δx2 represents variance of the position in the x-axis direction of the vehicle which is estimated by the estimation unit 22. Further, Δy represents an error of the position in the y-axis direction of the vehicle estimated by the estimation unit 22. That is, Δy2 represents variance of the position in the y-axis direction of the vehicle, which is estimated by the estimation unit 22. Further, Δθ represents the error of the azimuth of the vehicle, which is estimated by the estimation unit 22. That is, Δθ2 represents variance of the azimuth of the vehicle, which is estimated by the estimation unit 22. Δx2, Δy2 and Δθ2 are variances included by the error covariance matrix of the vehicle state estimation values which are estimated by the estimation unit 22. In this way, the evaluation amount is a value calculated by a sum of a value obtained by making the error of the position of the vehicle and the position of the link dimensionless by the error of the position of the vehicle which is estimated, and a value obtained by making the error of the azimuth of the vehicle and the azimuth of the link dimensionless by the error of the position of the vehicle which is estimated.

In the example in FIG. 4, the control unit 2 calculates an evaluation amount of the link L1 and an evaluation amount of the link L2 which are acquired as the map matching candidate links.

When the evaluation amount of the link L1 is set as $\tau 1$, the difference in the x-coordinate between the position M1 and the intersection point MM1 is set as $\delta x1$, the difference in the y-coordinate between the position M1 and the intersection point MM1 is set as $\delta y1$, and the difference between the angle $\theta 1$ and the angle $\theta 2$ is set as $\delta\theta 1$, the evaluation amount $\tau 1$ is expressed by equation (28) shown below.

$$\tau 1 = \delta x12/\Delta x2 + \delta y12/\Delta y2 + \delta\theta 12/\Delta\theta 2 \qquad (28)$$

When the evaluation amount of the link L2 is set as $\tau 2$, the difference in the x-coordinate between the position M1 and the intersection point MM2 is set as $\delta x2$, the difference in the y-coordinate between the position M1 and the intersection point MM2 is set as $\delta y2$, and the difference between the angle $\theta 1$ and the angle $\theta 3$ is set as $\delta\theta 2$, the evaluation amount $\tau 2$ is expressed by equation (29) shown below.

$$\tau 2 = \delta x22/\Delta x2 + \delta y22/\Delta y2 + \delta\theta 22/\Delta\theta 2 \qquad (29)$$

In the example in FIG. 4, the distance l1 is smaller than the distance l2. That is, the differences in the x-coordinate and the y-coordinate in the position M1 and the intersection point MM2 are smaller than the differences in the x-coordinate and the y-coordinate in the position M1 and the intersection point MM2. Further, in the example in FIG. 4, the difference between the angle $\theta 1$ and the angle $\theta 2$ is smaller than the difference between the angle $\theta 1$ and the angle $\theta 3$. Consequently, the value of $\tau 1$ which is the evaluation amount of the link L1 is smaller than the value of $\tau 2$ which is the evaluation amount of the link L2. Accordingly, the control unit 2 determines the link L1 with a small evaluation amount as the link to which the present location of the vehicle is matched.

In this way, the control unit 2 executes evaluation of the link which is a target of map matching based on the state of the vehicle which is estimated. As described above, at a time of evaluating the link, the control unit 2 evaluates the link based on variance included by the error covariance matrix of the vehicle state estimation value estimated by the estimation unit 22. The error covariance matrix is a matrix calculated based on the error covariance matrix of the vehicle state prediction value which are calculated taken into account the accumulated errors, and is a matrix including the errors which are calculated with high precision. Accordingly, the control unit 2 can accurately evaluate the link by using variance included by the error covariance matrix in evaluation of the link.

As described above, the navigation system 1 (the in-vehicle device) includes the observation unit 21 that observes the observables concerning a variation of the vehicle, and the estimation unit 22 that estimates the state quantities indicating the state of the vehicle by the Kalman filter. The estimation unit 22 calculates the prediction values of the state quantities of the vehicle, calculates the error covariance matrix (error) of the prediction values by the Kalman filter to which the error of the observable is inputted as the error of the state quantity in the relation of calculus with the observable, and calculates the estimation value of the state quantity of the vehicle and the error covariance matrix of the estimation value by the Kalman filter based on the prediction value and the error covariance matrix of the prediction value which are calculated.

Consequently, by inputting the error of the observable as the error of the state quantity having the relation of calculus, correlativity of the error of the observable and the error of the state quantity is decreased, and the error covariance matrix of the vehicle state prediction value can be calculated with the error of the observable which accumulate taken into consideration, so that the Kalman gain Kk can be accurately calculated, and the state of the vehicle can be precisely estimated by the Kalman filter.

Further, the estimation unit 22 calculates the error covariance matrix of the prediction value by the Kalman filter to which covariance of the error of the vehicle state estimation value which is calculated at the previous time and the error of the observable which is inputted as the error of the state quantity of the vehicle is inputted.

As described above, in equation (4), the proposition which is on the precondition that the error covariance matrix of the state quantity and the error covariance matrix of the system noise are independent from each other is used. However, when the error covariance matrix of the system noise is used as the error covariance matrix of the accumulating error, the error covariance matrix of the state quantity of the vehicle and the error covariance matrix of the accumulating error are not independent from each other. Therefore, by using equation (9) according to equation (26), that is, the equation to which the covariance of the error of the vehicle state estimation value which is estimated at the previous time and the error of the observable which is inputted as the error of the state quantity is inputted, the independency of the error covariance matrix of the state quantity of the vehicle, and the error covariance matrix of the accumulating error is eliminated, and the error covariance matrix of the vehicle state prediction value can be calculated accurately.

Further, the observation unit 21 observes the speed of the vehicle based on the output from the vehicle speed sensor 6 which detects the speed of the vehicle. The estimation unit 22 calculates the error covariance matrix of the prediction value by the Kalman filter to which the error of the speed of the vehicle is inputted as the error of the position of the vehicle.

Thereby, by decreasing the correlativity of the error of the speed of the vehicle and the error of the position of the vehicle, the error of the speed of the vehicle which accumulates can be taken into consideration, and the position of the vehicle can be precisely estimated by the Kalman filter.

Further, the observation unit 21 observes the angular speed of the vehicle based on the output from the gyro sensor 7 (the angular speed sensor) which detects the angular speed of the vehicle. The estimation unit 22 calculates the error covariance matrix of the prediction value by the Kalman filter to which the error of the angular speed of the vehicle is inputted as the error of the azimuth of the vehicle.

Thereby, the correlativity of the error of the angular speed of the vehicle and the error of the azimuth of the vehicle is decreased, whereby the error of the angular speed of the vehicle which accumulates can be taken into consideration, and the azimuth of the vehicle can be precisely estimated by the Kalman filter.

The observation unit 21 observes the acceleration of the vehicle based on the output from the acceleration sensor 8 which detects the acceleration of the vehicle. The estimation unit 22 calculates the error covariance matrix of the prediction value by the Kalman filter to which the error of the acceleration of the vehicle is inputted as the error of the speed of the vehicle.

Thereby, the correlativity of the error of the acceleration of the vehicle and the error of the speed of the vehicle is decreased, whereby the error of the acceleration of the vehicle which accumulates can be taken into consideration, and the speed of the vehicle can be precisely estimated by the Kalman filter.

The aforementioned embodiment only illustrates one mode of the present invention, and modifications and applications can be arbitrarily made within the range without departing from the gist of the present invention.

For example, FIG. 1 is a schematic diagram illustrating the functional configuration of the navigation system 1 by dividing the functional configuration in accordance with the main processing contents in order to facilitate understanding of the invention of the present application, and the configuration of the navigation system 1 can be divided into a larger number of components in accordance with the processing contents. Further, a single component also can be divided to execute more processing.

Further, for example, processing units in the flowcharts in FIG. 2 and FIG. 3 are divided in accordance with main processing contents, in order to facilitate understanding of the processing of the control unit 2, and the present invention is not limited by the way of dividing the processing units and the names of the processing units. The processing of the control unit 2 may be divided into a larger number of processing units in accordance with the processing contents. Further, the single processing unit may be divided to include more processing.

Further, for example, in the aforementioned embodiments, as the navigation system 1, an in-vehicle type is illustrated, but the mode of the navigation system 1 is optional, and may be a portable device that is carried by a pedestrian, for example.

REFERENCE SIGNS LIST

1 Navigation system (in-vehicle device)
6 Vehicle speed sensor (sensor)
7 Gyro sensor (sensor)
8 Acceleration sensor (sensor)
21 Observation unit
22 Estimation unit

The invention claimed is:

1. An in-vehicle device that is loaded on a vehicle, comprising:
a controller that includes a Central Processing Unit and receives outputs from a vehicle speed sensor, a gyro sensor, an acceleration sensor, and a GPS receiver,
a memory that stores control programs and map data; and
a display panel that displays a position of the vehicle with the map data under control of the controller,
wherein the controller includes:
an observation circuit that observes an observable concerning a variation of a speed, an angular speed, and an acceleration of the vehicle, based on the outputs from the vehicle speed sensor, the gyro sensor, the acceleration sensor, and the GPS receiver, and that calculates an error of the speed of the vehicle, an error of the angular speed of the vehicle, and an error of the acceleration of the vehicle; and
an estimation circuit that estimates a x-coordinate x and a y-coordinate y of a position of the vehicle, an azimuth θ, a speed v, and an angular speed ω of the vehicle by a state quantity expressed by the following Equation (1) as a state quantity indicating a state of the vehicle by a Kalman filter, $$\begin{bmatrix} x_{k+1} \\ y_{k+1} \\ \theta_{k+1} \\ v_{k+1} \\ \omega_{k+1} \end{bmatrix} = \begin{bmatrix} x_k + \cos(\theta_k)v_k T \\ y_k + \sin(\theta_k)v_k T \\ \theta_k + \omega_k T \\ v_k \\ \omega_k \end{bmatrix} + q_k \quad (1)$$

wherein the estimation circuit
calculates a prediction value of the state quantity of the vehicle,
calculates an error $P_{k+1|k}$ of the prediction value, by the Kalman filter to which a value calculated by time-integrating the error of the speed of the vehicle, the error of the angular speed of the vehicle, and the error of the acceleration of the vehicle as an error of the observable at a certain time is inputted to the following Equation (2):

$$P_{k+1|k} = F_k P_{k|k} F_k^T + Q_k + 2 \cdot C_k \quad (2)$$

wherein $F_k$ represents a Jacobi matrix obtained from a state equation indicating the state of the vehicle, $P_{k|k}$ represents an error covariance matrix at a time point k which is estimated based on the information up to the time point k, F represents the Jacobi matrix calculated by the Equation (1) which represents the state quantity of the vehicle, a superscript T in F represents a transposed matrix, $Q_k$ represents an error covariance matrix of a system noise, $C_k$ represents the covariance matrix of errors of the vehicle state estimation values estimated at a previous time, and errors of the observables which the observation circuit observes, and $Q_k + 2 \cdot C_k$ represents the system noise;
calculates a Kalman gain by the error of the prediction value calculated by the Equation; and
calculates an estimation value of the state quantity of the vehicle and an error of the estimation value by the Kalman filter, based on the Kalman gain and the prediction value which are calculated.

2. The in-vehicle device according to claim 1,
wherein the estimation circuit
calculates the error of the prediction value, the error of the speed of the vehicle as an error of the position of the vehicle, the error of the angular speed of the vehicle as an error of the azimuth of the vehicle, and the error of the acceleration of the vehicle as an error of the speed of the vehicle, by the Kalman filter to which covariance of an error of the estimation value of the state quantity which is calculated at a previous time, and the error of the observable which is inputted as an error of the state quantity is inputted.

3. The in-vehicle device according to claim 1,
wherein the certain time indicates one time point from a past time to a present time.

4. An estimation method that estimates a state quantity indicating a state of a vehicle by a Kalman filter, comprising:
calculating a prediction value of the state quantity of the vehicle by a Central Processing Unit of a controller of an in-vehicle device in which a memory stores control programs and map data, and a display displays a position of the vehicle with the map data under control of the controller;
observing an observable concerning a variation of a speed, an angular speed, and an acceleration of the vehicle, based on outputs from a vehicle speed sensor, a gyro sensor, an acceleration sensor, and a GPS receiver, and calculating an error of the speed of the vehicle, an error of the angular speed of the vehicle, and an error of the acceleration of the vehicle;

estimating a x-coordinate x and a y-coordinate y of a position of the vehicle, an azimuth θ, a speed v, and an angular speed ω of the vehicle by a state quantity expressed by the following Equation (1) as a state quantity indicating a state of the vehicle by a Kalman filter, $$\begin{bmatrix} x_{k+1} \\ y_{k+1} \\ \theta_{k+1} \\ v_{k+1} \\ \omega_{k+1} \end{bmatrix} = \begin{bmatrix} x_k + \cos(\theta_k)v_k T \\ y_k + \sin(\theta_k)v_k T \\ \theta_k + \omega_k T \\ v_k \\ \omega_k \end{bmatrix} + q_k \quad (1)$$

calculating an error $P_{k+1|k}$ of the prediction value, by the Kalman filter to which a value calculated by time-integrating the error of the speed of the vehicle, the error of the angular speed of the vehicle, and the error of the acceleration of the vehicle as an error of an observable at a certain time, concerning a variation of the speed, the angular speed, and the acceleration of the vehicle which is observed based on an output from a sensor, is inputted to the following Equation (2):

$$P_{k+1|k} = F_k P_{k|k} F^T_k + Q_k + 2 \cdot C_k \quad (2)$$

wherein $F_k$ represents a Jacobi matrix obtained from a state equation indicating the state of the vehicle, $P_{k|k}$ represents an error covariance matrix at a time point k which is estimated based on the information up to the time point k, F represents the Jacobi matrix calculated by the Equation (1) which represents the state quantity of the vehicle, a superscript T in F represents a transposed matrix, $Q_k$ represents an error covariance matrix of a system noise, $C_k$ represents the covariance matrix of errors of the vehicle state estimation values estimated at a previous time, and errors of the observables which the observation circuit observes, and $Q_k + 2 \cdot C_k$ represents the system noise;

calculating a Kalman gain by the error of the prediction value calculated by the Equation; and calculating an estimation value of the state quantity of the vehicle and an error of the estimation value by the Kalman filter, based on the Kalman gain and the prediction value which are calculated.

5. The estimation method according to claim 4, wherein the error of the prediction value, the error of the speed of the vehicle as an error of the position of the vehicle, the error of the angular speed of the vehicle as an error of the azimuth of the vehicle, and the error of the acceleration of the vehicle as an error of the speed of the vehicle, are calculated by the Kalman filter to which covariance of an error of the estimation value of the state quantity which is calculated at a previous time, and the error of the observable which is inputted as an error of the state quantity is inputted.

6. The estimation method according to claim 4, wherein the certain time indicates one time point from a past time to a present time.

\* \* \* \* \*